US006192701B1

(12) United States Patent
Goth et al.

(10) Patent No.: US 6,192,701 B1
(45) Date of Patent: Feb. 27, 2001

(54) SEALED MULTI-CHIP MODULE COOLING SYSTEM

(75) Inventors: Gary F. Goth, Pleasant Valley; John J. Loparco; Prabjit Singh, both of Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/378,988

(22) Filed: Aug. 23, 1999

(51) Int. Cl.$^7$ ..................................................... F25D 23/12
(52) U.S. Cl. ............................................................ 62/259.2
(58) Field of Search .............................................. 62/259.2

(56) References Cited

U.S. PATENT DOCUMENTS

| | | |
|---|---|---|
| 4,766,316 | 8/1988 | Jungkman ............................ 250/352 |
| 4,800,422 | 1/1989 | Sanwo et al. ......................... 357/82 |
| 4,950,181 | 8/1990 | Porter .................................. 439/485 |
| 5,247,424 | 9/1993 | Harris et al. ......................... 361/704 |
| 5,343,358 | * 8/1994 | Hilbrink .............................. 361/700 |
| 5,349,823 | 9/1994 | Solomon ................................. 62/6 |
| 5,365,749 | * 11/1994 | Porter ................................. 62/259.2 |
| 5,474,120 | * 12/1995 | Severson et al. ...................... 165/39 |
| 5,574,627 | 11/1996 | Porter .................................. 361/719 |
| 5,660,047 | * 8/1997 | Paganessi ............................... 62/64 |
| 5,839,284 | 11/1998 | Wyatt et al. ........................... 62/3.2 |
| 5,855,119 | * 1/1999 | Pfister et al. ........................ 62/259.2 |
| 6,009,717 | * 1/2000 | Hernandez et al. ................... 62/262 |

* cited by examiner

*Primary Examiner*—William Doerrler
*Assistant Examiner*—Mark Shulman
(74) *Attorney, Agent, or Firm*—Floyd A. Gonzalez; Cantor Colburn LLP

(57) ABSTRACT

A cooling system for absorbing thermal energy from an integrated circuit device while preventing the formation of condensation thereon. The cooling system comprises a evaporator unit mounted on an integrated circuit device, housed within an airtight enclosure which is evacuated and then pressurized with dry air.

12 Claims, 5 Drawing Sheets

SEALED MULTI-CHIP MODULE COOLING SYSTEM

BACKGROUND OF THE INVENTION

The present invention relates to cooling technology for electronic packaging for computer systems, and, more particularly, relates to means for cooling and preventing the formation of condensation on cooled components within a computer system.

The high circuit densities and operating frequencies in modern integrated circuit devices and multi-chip modules of today's computer systems has resulted in a significant increase in the power dissipated by such chip and module components. No matter how fast one wishes to operate a given electronic circuit chip, there almost always is the potential for running it faster if the chip were to be cooled further and more thermal energy is removed during its operation. This is true of computer processor circuit chips and more particularly of such chips disposed within multichip modules that generate significant amounts of heat. Because of the demand to run processor modules at increasingly higher speeds, the clock frequencies at which the devices must operate also increases. Power generation correspondingly rises in proportion to the clock frequency, generating thermal demands in terms of energy which must be removed for faster, safer, and more reliable circuit operation. It is required that cooling arrangements be provided so that the heat generated by the operation of these components be effectively and efficiently removed in order to maintain the temperature of the devices within the limits that will keep the operating parameters of the devices in a predetermined range, and, that will keep the operating parameters of the devices in a predetermined range, and, further, to prevent the damage or destruction of the integrated circuit devices by overheating from the high temperatures generated.

Using refrigeration technology, integrated circuit chips and multi-chip modules readily can be cooled to appropriately low temperatures. In addition, however, to the essential of cooling to prevent damage from overheating, it is also recognized that cooling offers marked advantages in circuit speed, system throughput, and component reliability. For example, it is known that a CMOS circuit will operate at higher clock speeds as the circuit temperature is lowered, and, it has been reported that the processor frequencing of a CMOS processor has been improved by nearly threefold by cooling the processor to temperatures around −200° C.

Various techniques for the cooling of integrated circuit electronic devices are known and many have been implemented with success. Some practiced techniques involve conventional methods such as by directing ambient air onto the components to be cooled; by sealing the computer cabinet and refrigerating the interior of the cabinet; as well as by immersing components in coolants such as liquid nitrogen. Individual integrated chip or multi-chip module components also have been cooled through specialized devices such as hollow cold plates which are attached to the components to be cooled. Liquid coolants can be circulated through the hollow cold plates to effect cooling of the attached components.

However, cooling of the electronic components to a temperature below the ambient environment dew point results in condensation problems in that moisture will condensate on the cooled components and the structures and components to which the cooled components may be attached. This condensation can damage and literally destroy the electronic circuitry associated with the integrated chip or multi-chip module and the circuit board on which it is mounted.

Accordingly, a cooling system is needed for an integrated chip or multi-chip module device which can effectively reduce the temperature of the device to below ambient dew point without causing damage to the device through the effects of condensation.

SUMMARY OF THE INVENTION

The above-discussed and other drawbacks and deficiencies of the prior art are overcome or alleviated by the present invention.

Now, an improved system for cooling integrated circuit devices within a computer system has been developed whereby condensation is prevented from forming on the cooled devices. According to the present invention, a cooling system is provided which comprises a cooling evaporator unit having a thermal interface in thermal communication with an integrated circuit device mounted on a substrate within a computer system. The integrated circuit device typically is a multi-chip module (MCM) mounted on a planar circuit board contained within the cabinet of a computer system. The evaporator, generally comprising a thermal block, typically copper or aluminum, having coolant flow passages through its mass, is connected to a refrigeration unit to circulate coolant through the evaporator to cool the integrated circuit device to a desired temperature. To optimize performance of the chip device, it generally is cooled to a temperature below the dew point of the surrounding atmosphere. Typically, the device is cooled to a temperature ranging from about −10° C. to about +10° C.

The refrigeration unit typically includes a compressor, condenser, and expansion device connected in a closed refrigeration loop with the coolant flow passages in the thermal block. The coolant used may be any coolant fluid; R134A and R507, standard refrigerants known and used in the art, are preferred because of their environmentally friendly composition.

The cooling evaporator is enclosed within a housing. The evaporator block is attached, through a thermal grease layer, to the cover or hat of the integrated circuit devices. The integrated circuit devices are mounted on a printed circuit board substrate via solder interconnections. The cooling evaporator unit and the integrated circuit devices with which it is in thermal communication both are enclosed within the evaporator housing. The housing typically comprises a sealed aluminum chassis to which the thermal block is attached by suitable screws and insulating spacers. The thermal block in turn is attached to the integrated chip device, such as a MCM, by a series of bolts passing through the thermal block into the MCM cover or hat. The housing is designed to seal to the substrate so as to enclose the evaporator unit and the MCM mounted on the substrate. The seal between the housing and the substrate typically is accomplished through a suitable compliant gasket member, preferably a c-shaped gasket. A preferred gasket material is a butyl rubber. The housing is designed to form an airtight enclosure for the evaporator unit and the integrated circuit device when the housing is sealed to the substrate.

The housing is fitted with various sealed ports which connect to the evaporator unit. These ports provide flow communication for the coolant in and out of the evaporator from the refrigeration unit, and also include flow communication from a vacuum source to an air cavity around the MCM and evaporator. The vacuum source can be activated to reduce the pressure within the enclosure. This pressure reduction serves to draw off any moisture trapped within the enclosure during attachment of the housing enclosure to the substrate. A pressure detection device also is provided in communication with the enclosure in order to determine that the reduced pressure within the enclosure is maintained after the vacuum source is deactivated. The maintenance of the reduced pressure evidences the accomplishment of an airtight condition within the enclosure. A pressurized dry gas system, typically pressurized dry air, also is in flow communication with the enclosed evaporator, so that, once the airtight condition of the enclosure is verified, a positive pressure of dry gas can be maintained within the enclosure during operation of the cooling system. Preferably, the source of dry gas can be air drawn from the blower system of the computer cabinet, first passed through a desiccant canister to remove moisture.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DETAILED DESCRIPTION OF THE INVENTION

Figure 1:
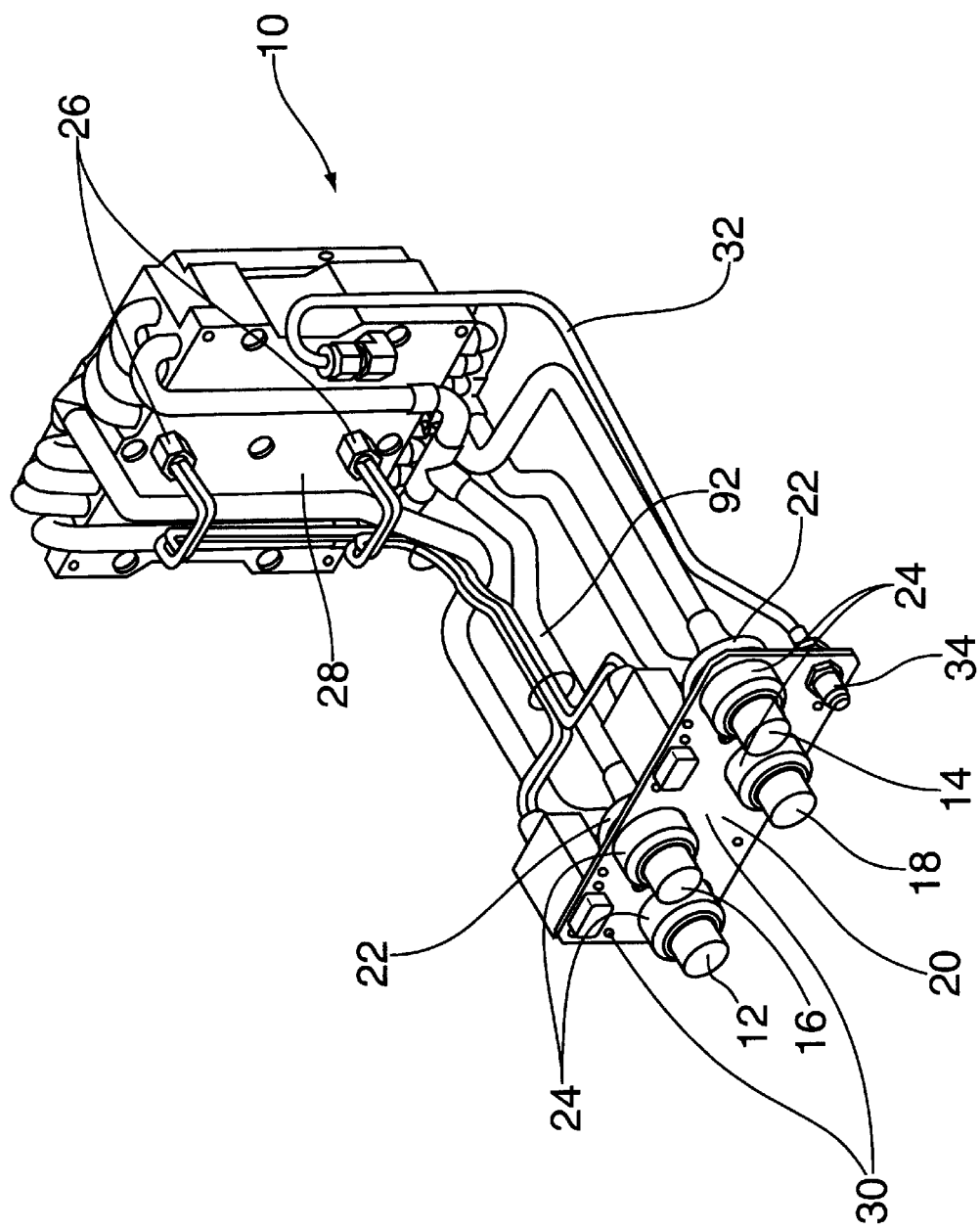
FIG. 1 is a perspective view of an embodiment of a cooling evaporator forming one component of the cooling system pursuant to the present invention.

Referring to FIG. 1 a cooling evaporator unit 10 is shown comprising thermal block 28. Thermal block 28 includes dual coolant flow passage circuits, and accordingly shows dual coolant inlet conduits 12 and 14 and dual coolant outlet conduits 16 and 18. Only one of the coolant circuits is operated at a time; the second circuit is a redundant backup in the event one circuit becomes non-operational. Coolant conduits 12, 14, 16, 18 terminate at face plate 20 through offset insulators 22 and sealable connectors 24 in a diagonally offset configuration.

Refrigeration units (not shown) are connected in flow communication through connectors 24 to circulate coolant through the conduits. Insulators 22 help prevent cooling loss by thermal conduction through face plate 20. Two thermistor tubes 26, one each located in the top and bottom portions of thermal block 28 receive respective thermistors whose respective cables 92 are sheathed in tubes 26 and terminate at connectors 30 mounted on chassis faceplate 20. A vacuum tube 32 passes through the thermal block 28 and terminates in a pressure detection test valve 34 mounted on faceplate 20.

Figure 2:
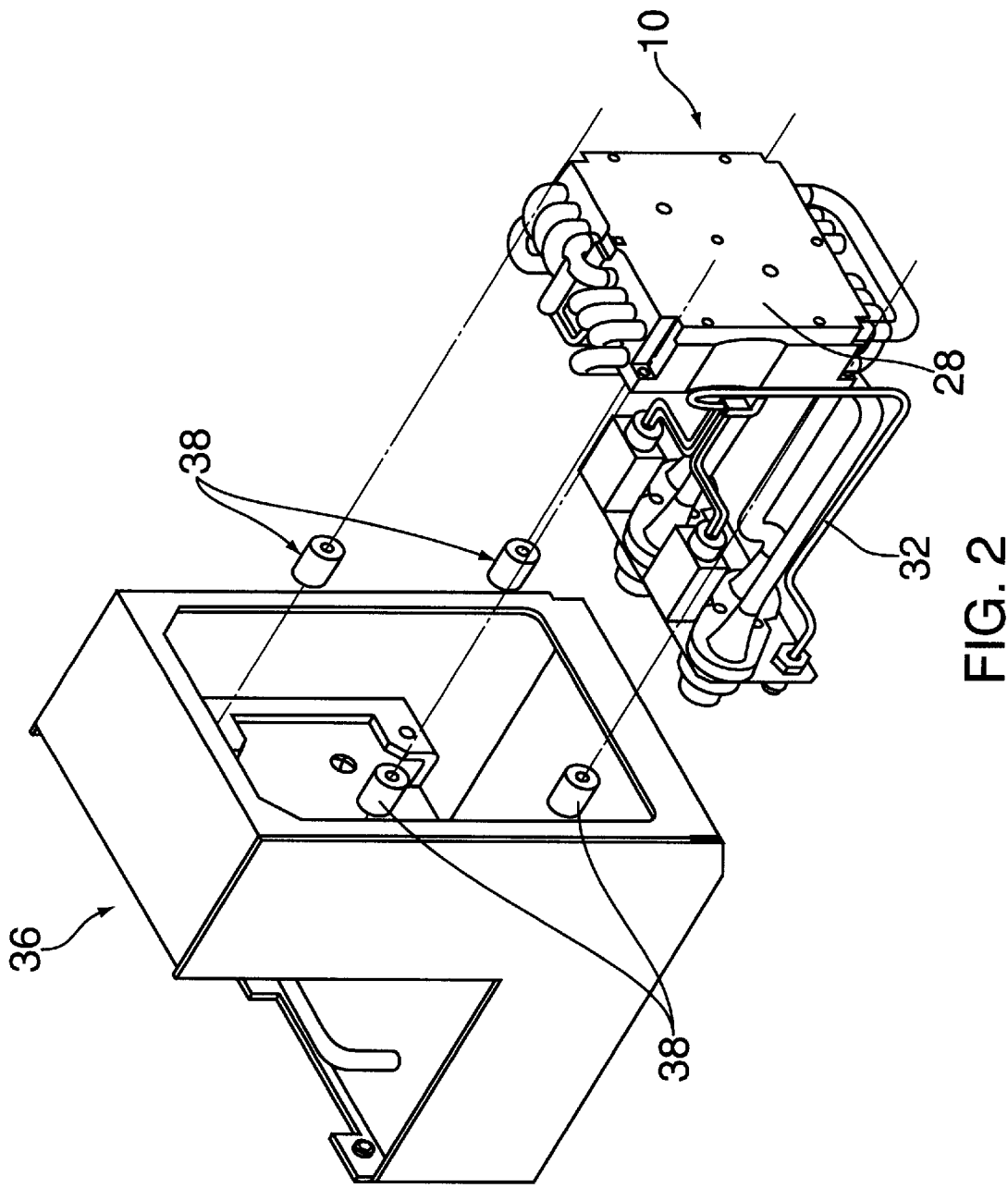
FIG. 2 is an exploded view illustrating an embodiment of a cooling evaporator unit and its housing enclosure.

FIG. 2 illustrates an evaporator unit 10 and its housing enclosure 36 in an exploded view. The enclosure 36 is a welded aluminum chassis. The evaporator unit 10 is secured within housing enclosure 36 through a series of four bolts (not shown) passing through bored holes at the four corners of the thermal block 28. The bolts secure the evaporator unit 10 through spacers 38 which serve to help insulate the unit 10 from the walls of enclosure 36 to prevent cooling loss by thermal conduction through the aluminum walls.

Figure 3:
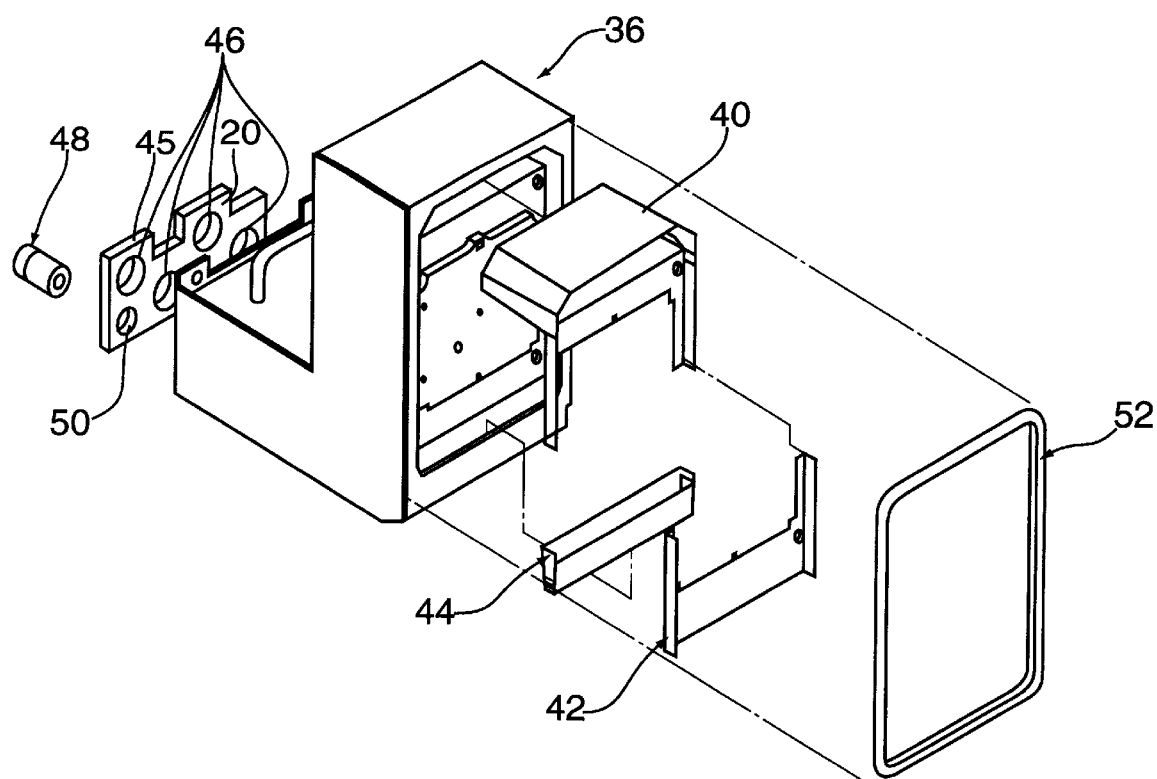
FIG. 3 is an exploded view showing an evaporator housing enclosure illustrating chassis structure and accompanying seals, membranes and gaskets.

In FIG. 3, an exploded view of housing enclosure 36 is illustrated, including various seals, membranes, and gaskets which serve to create an airtight condition when the enclosure is installed and in use. Stainless steel upper membrane 40, lower membrane 42, and lower pocket membrane 44 fit into the peripheral recesses of enclosure 36 and help to preserve the airtightness of the walls. When fitted into place, membranes 40 and 42 form pockets into which two small bags of desiccant (not shown) are positioned to help quickly dry out the inside of the enclosure once the evaporator block is mounted onto the MCM hat. Face plate 20 has a horizontal hole pattern 46 to receive horizontal insulators which secure the sealable connectors from the terminations of the coolant conduits of the evaporator. Insulator 48 fits into face plate hole 50 and serves to receive and secure a pressure detection test valve which is connected by a vacuum tube to the thermal block of the cooling evaporator. Faceplate gasket insulator 45 seals faceplate 20 to enclosure 36. Gasket 52 typically is a C-ring or similarly shaped compliant seal member (preferably formed from a butyl rubber) and, when the evaporator within enclosure 36 is in operational position over an MCM on a circuit board, forms an airtight, but breakable, seal between the enclosure 36, and the circuit board substrate.

Figure 4:
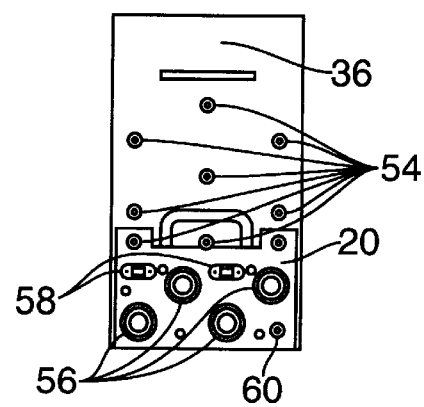
FIG. 4 is an end view illustrating an evaporator housing enclosure and its various external seals and connections.

FIG. 4 shows an end view of the housing enclosure 36, as viewed from the faceplate 20 end of enclosure 36. FIG. 4 simply depicts the seven screw plug O-ring seals 54 which screw into seven holes in the chassis of the aluminum enclosure 36 through which mounting screws (not shown) pass through to holes in the thermal block of the evaporator to attach the thermal block to the top or hat of the MCM. Seals 56, 58, and 60 on face plate 20 serve to seal the terminations of the refrigeration coolant conduits, the thermistor cables, and vacuum tube, respectively.

Figure 5:
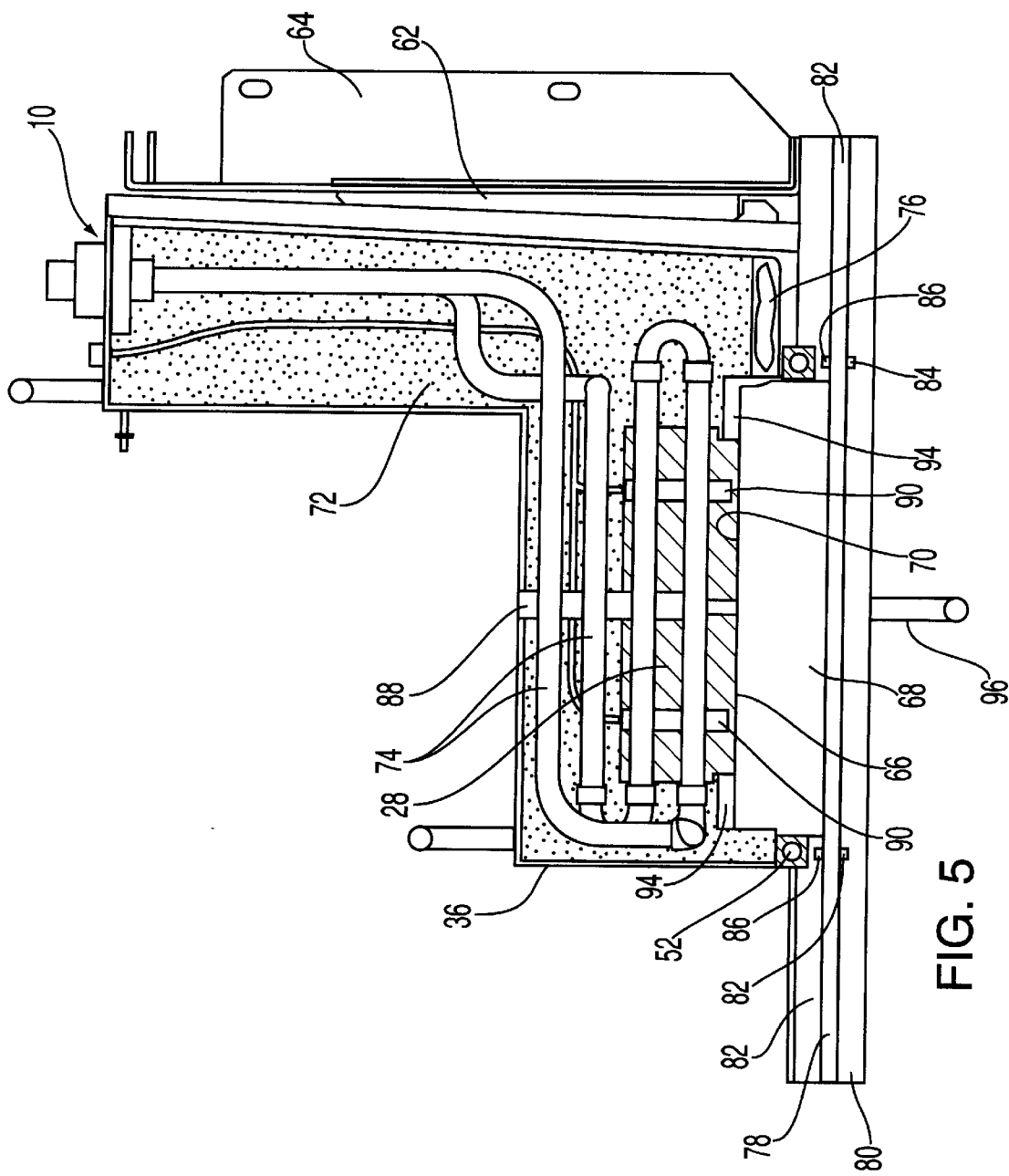
FIG. 5 is a cross sectional view depicting an evaporator unit housed within an enclosure and installed on a substrate in a configuration to cool a multi-chip module.

FIG. 5 is a cross sectional view of a cooling evaporator unit 10 installed in an operational configuration, as the housing enclosure 36 is slid into place, guided into place by inclined ramps 62 mounted to a support bracket 64. The thermal interface 66 of the thermal block 20 is in thermal communication with the multi-chip module 68 (MCM). A thin layer of oil 70 increases thermal communication between the two surfaces. As the MCM 30 generates thermal energy, it is conducted away through the evaporator 10 which is controlled by a cooling system controller (not shown).

In preferred embodiments of the present invention, it is clearly desirable that the thermal block 20 be made as flat as possible to conform to the exterior packaging of electronic module 68. However, in those circumstances in which module 68 comprises a curved or even a stepped design, it is nonetheless possible to provide an appropriate thermal block by correspondingly machining or molding the thermal interface 66 of the thermal block 20. However, in general, a good flat thermal mating surface is preferable.

The evaporator block 28 is preferably well insulated from the surrounding air to help prevent cooling loss. The housing enclosure 36 is filled with a urethane foam 72 which insulates the thermal block 28 and the refrigerant coolant conduits 74 from thermal losses due to air which is relatively warmer than the thermal block 28. A desiccant bag 76 located below the thermal interface 66 helps to absorb any condensation which runs off the thermal block 28 or the MCM 68.

The MCM 68 is mounted to a planar board 78 which is strengthened by rear stiffener 80 and front stiffener 87. The stiffeners 80 and 82 are circumferentially sealed onto the planar board 78 by respective rear and front O-rings 84 and 86. A gasket 52 circumferentially seals the front stiffener 82 and the housing enclosure 36 to create an airtight seal at the perimeter mating surface.

Once the housing enclosure 36 is in place against the MCM 68, screws (not shown) are inserted into mounting holes 88. The screw threads are received by matching threaded holes (not shown) in the MCM 68 and the evaporator is further mated to the MCM 68 by tightening of the screws. The holes in enclosure 36 through which these screws pass are sealed with screw plug O-ring seals 54 (shown in FIG. 4).

The two thermistor holes 90, one each located in the top and bottom portion of the thermal block 28 receive respective thermistors 26 whose respective cables 92 terminate at their respective connectors 24 mounted on the enclosure faceplate 20.

Vacuum tube 32 (shown in FIG. 1) is connected to thermal block 28 and is in flow communication with air cavity 94 around the periphery of the thermal interface 66 between thermal block 20 and MCM 68 and around and below MCM 68. After the evaporator unit 10 is attached to MCM 68 and sealed to circuit board 28 through gasket 52, a vacuum source (not shown) is attached to vacuum tube 32 through pressure detection test valve 34 mounted on face plate 20 (see FIG. 1). The vacuum source is activated to reduce the pressure to a desired level within the enclosed air space formed by stainless steel membranes (40, 42, and 44), evaporator block 28, circuit board 78, and gasket 52. When the vacuum source is deactivated, pressure detection test valve 34 serves to indicate whether the reduced pressure within this enclosed air space is maintained, so as to verify the airtight integrity of the various seals, membranes, gaskets, and plugs.

The vacuum source utilized to reduce the pressure within evaporator enclosure 36 through pressure detection test valve 34 and vacuum tube 32 preferably is a vacuum source external to the server cabinet 100. The vacuum source (not shown) used typically is a vacuum device such as a portable hand held pump; the vacuum source is deactivated following pressure reduction in the enclosure 36 after installation of the evaporator unit on the MCM mounted on the circuit board.

Once the airtight condition of the mounted evaporator unit 10 is verified by pressure test valve 34, dry gas, typically dry air, is introduced into the air space formed by the circuit board and the evaporator housing enclosure 36 through dry gas port 96 so as to create a positive pressure of dry gas within the enclosure at all times. Accordingly, not only is the enclosure evacuated to remove trapped moisture during assembly, but also the installed enclosure airspace is filled with dry air under positive pressure, so that if there is a breakdown in any of the seals over time, no ambient moist air will be able to enter the enclosure. The rate at which this dry air is introduced is constrained by using an appropriate length capillary tube between the dry air source and the air space within the evaporator to board assembly. This ensures long life of the dry air supply.

Figure 6:
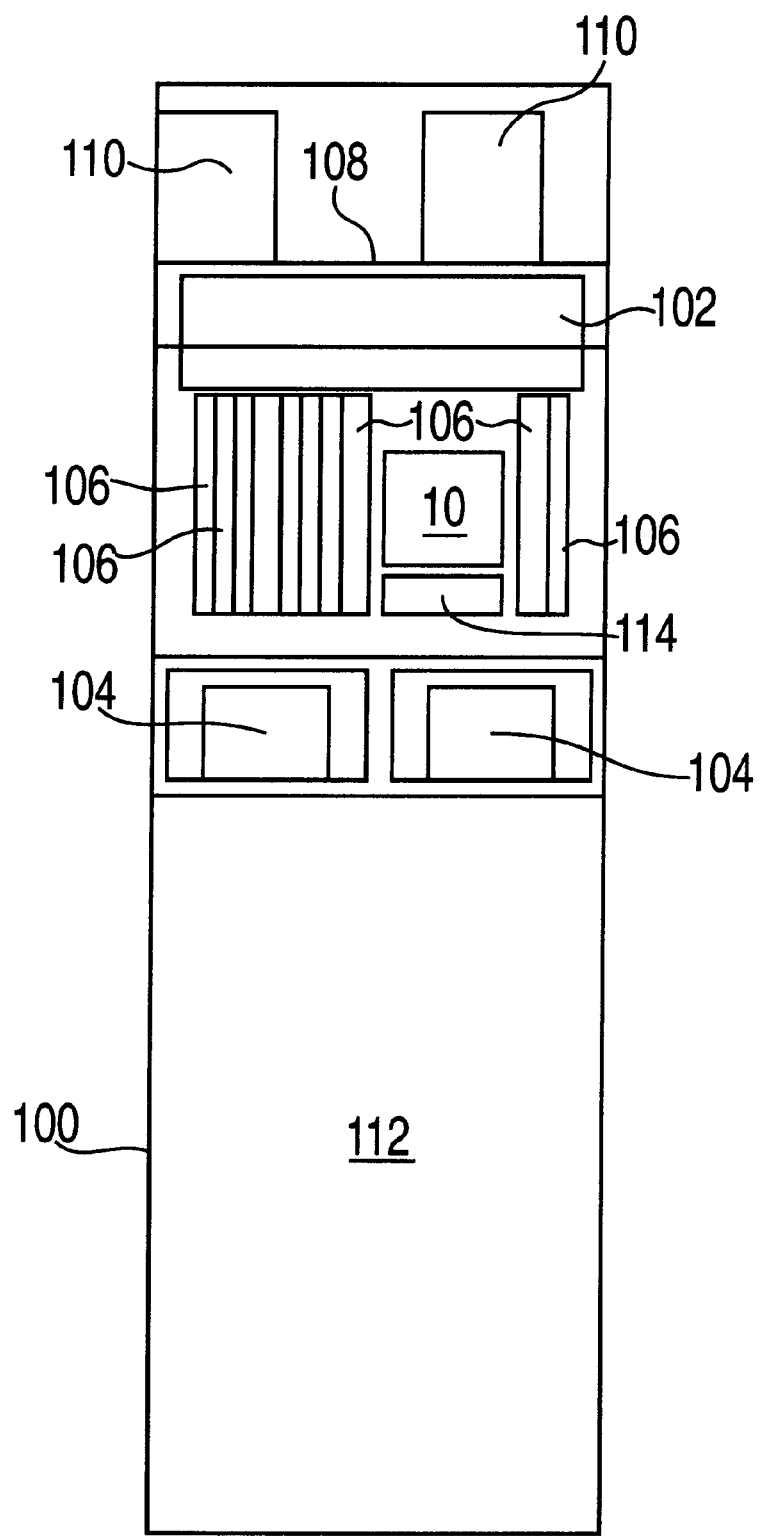
FIG. 6 is a simplified front view showing the arrangement of components in a typical computer server cabinet.

FIG. 6 is a simplified front view showing the arrangement of components in a typical server cabinet in which the present invention is included in the system.

The server system consists of cabinet 100 having air inlet opening 102 for the passage of air into the system for circulation there through. The flow of air is induced by means of one or more blowers 104.

Fans or other air-moving devices could also be employed for this same purpose. However, blowers are preferred because of their efficiency. In the apparatus shown in FIG. 6 air moves from inlet 102 to be circulated through the cabinet 100 to an exhaust outlet (not shown). The flow of air is employed for the particular purpose of cooling certain of the electronic components disposed on printed circuit cards or so-called "books" 106. Air flows down between these books or cards through blower(s) 104.

The description provided thus far is therefore seen to disclose a preferred method for cooling certain of the electronic components, namely, those components located on cards 106 which are of sufficiently low power that air cooling is an appropriate modality. However, an important feature of the present invention is directed to the specific means and systems employed for cooling an electronic module (MCM). In preferred embodiments of the present invention the MCM includes circuits for data processor components associated with a mainframe or server computer system. In particular, the system shown in FIG. 6 illustrates the placement of cooling evaporator 10 which forms a significant aspect of the present invention. Evaporator 10 is connected by means of flexible refrigerant lines (not shown for clarity) to a refrigeration system present in the upper portion of cabinet 100 above shelf 108. The refrigeration system 110 for cooling evaporator 10 and, thus, the MCM directly behind evaporator 10 and in thermal contact therewith, includes items such as motors, compressors and condensers together with an expansion device. Thus, the system shown in FIG. 6 represents an apparatus in which both air cooling and direct refrigerant cooling is employed. It is particularly useful for a proper understanding to note that the MCM is not mounted in a sideways fashion as are cards 106 primarily because of the fact that the MCM typically possesses a very large number of pins for achieving connection and communication with other circuits in the computer and/or with other computer systems. Thus, the I/O (input/output) pin requirements for the MCM dictate that it preferably be mounted in the fashion shown. In FIG. 6, this MCM electronic module is shown disposed beneath evaporator 10 which is visible in FIG. 6.

The dry air used to pressurize the evaporator enclosure 10 through dry air port 96 preferably is air provided from air blowers 104 after passing through desiccant canister 114 to remove moisture from the air source.

As shown in the figure area 112 may include the same components as shown in the top half of the cabinet. Additionally, area 112 may also include power supply components (a power cage, e.g.) Along with its own air-moving device. However, the components disposed in are 112 are not otherwise directly relevant to the present invention.

While the invention has been described with reference to specific embodiments thereof, it is intended that all matter contained in the above description is shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention as defined in the amended claims.

We claim:

1. A cooling system for absorbing thermal energy from an integrated circuit device mounted on a printed circuit board substrate comprising:

a cooling evaporator unit having a thermal interface in thermal communication with said integrated circuit device, said evaporator being connected to a refrigeration unit for cooling said integrated circuit device below the dew point of the surrounding environment;

a housing enclosing said evaporator unit and said integrated circuit device and sealed to said printed circuit board substrate to form an airtight enclosure;

a vacuum source in flow communication with the enclosed evaporator unit to reduce the pressure within the enclosure; and a pressurized dry gas system in flow communication with the enclosed evaporator unit to maintain a positive pressure of dry gas within the enclosure, after the vacuum source has been deactivated.

2. The cooling system of claim 1 including a pressure detection device to verify the integrity of the airtight enclosure by determining that the reduced pressure within the enclosure is maintained after the vacuum source is deactivated.

3. The cooling system of claim 1 wherein the evaporator unit comprises a thermal block housing coolant flow passages through its mass, said coolant flow passages being in flow communication with said refrigeration unit to supply coolant thereto for cooling said integrated circuit device.

4. The cooling system of claim 2 wherein the vacuum source is an external source connectable to the evaporator unit by flow communication through a vacuum tube passing through said thermal block.

5. The cooling system of claim 1 wherein the pressure detection device is a pressure test valve through which the vacuum source is connected in flow communication with the evaporator unit.

6. The cooling system of claim 1 wherein the pressurized dry gas system is dry air drawn from an air-moving device which first passes ambient air through a desiccant to remove moisture before introducing the dry air to the enclosure.

7. A method for cooling and preventing the formation of condensation on an integrated circuit device mounted on a substrate comprising:

providing an evaporator unit having a thermal interface in thermal communication with said integrated circuit device;

providing a refrigeration unit connected to said evaporator unit to circulate a coolant fluid through said evaporator unit to cool said integrated circuit device below the dew point of the surrounding environment;

providing an airtight enclosure housing said evaporator unit and said integrated circuit device and sealed to said substrate;

reducing the pressure within said enclosure through a vacuum source in flow communication with said evaporator unit; and pressurizing the enclosure, after the pressure has been reduced, through a dry gas system in flow communication with the evaporator to maintain a positive pressure of dry gas within the enclosure during operation of the cooling system.

8. The method of claim 7 including verifying the integrity of the airtight enclosure by determining with a pressure detection device that the reduced pressure within the enclosure is maintained after the vacuum source is deactivated.

9. The method of claim 7 wherein said refrigeration unit circulates coolant through coolant flow passages in a thermal block of the evaporator unit.

10. The method of claim 7 wherein said enclosure is sealed to a circuit board substrate with a butyl rubber gasket.

11. The method of claim 7 wherein an external vacuum source is connected in flow communication with a thermal block of the evaporator unit through a pressure detection test valve which verifies the reduced pressure within the enclosure after the vacuum source is deactivated.

12. The method of claim 7 wherein the enclosure is pressurized with dry air after verification of the airtight enclosure, said dry air passing from an air moving device through a desiccant to remove moisture from the air.

* * * * *

UNITED STATES PATENT AND TRADEMARK OFFICE
CERTIFICATE OF CORRECTION

| | |
|---|---|
| PATENT NO. | : 6,192,701 B1 |
| APPLICATION NO. | : 09/378988 |
| DATED | : February 27, 2001 |
| INVENTOR(S) | : Gary F. Goth et al. |

It is certified that error appears in the above-identified patent and that said Letters Patent is hereby corrected as shown below:

<u>Title Page,</u>
Item (57), Abstract,
Line 3, after "comprises" delete "a" and insert therefor --an--.

<u>Column 3,</u>
Line 28, after "evaporator", insert --unit--.

<u>Column 4,</u>
Line 47, after "block", delete "20" and insert therefor --28--.
Line 49, after "MCM", delete "30" and insert therefor --68--.
Line 54, after "block", delete "20" and insert therefor --28--.
Line 60, after "block", delete "20", and insert therefor --28--.

<u>Column 5,</u>
Line 27, after "block", delete "20" and insert therefor --28--.
Line 35, after "board", delete "28" and insert therefor --78--.

<u>Column 6,</u>
Line 54, after "e.g.)", delete "Along" and insert therefor --along--.
Line 55, after "in", delete "are" and insert therefor --area--.
Line 58, after "description", delete "is".

UNITED STATES PATENT AND TRADEMARK OFFICE
CERTIFICATE OF CORRECTION

PATENT NO.       : 6,192,701 B1
APPLICATION NO.  : 09/378988
DATED            : February 27, 2001
INVENTOR(S)      : Gary F. Goth et al.

It is certified that error appears in the above-identified patent and that said Letters Patent is hereby corrected as shown below:

<u>Column 7,</u>
Line 7, after "evaporator", insert --unit--.
Line 35, after "of", delete "1" and insert therefor --2--.

Signed and Sealed this

Twenty-third Day of October, 2007

JON W. DUDAS
*Director of the United States Patent and Trademark Office*